US010127099B2

(12) United States Patent
Zhou et al.

(10) Patent No.: US 10,127,099 B2
(45) Date of Patent: Nov. 13, 2018

(54) BAD SECTOR REPAIR METHOD AND APPARATUS

(71) Applicant: Huawei Technologies Co., Ltd., Shenzhen (CN)

(72) Inventors: Meng Zhou, Chengdu (CN); Yan Li, Chengdu (CN); Jianhua Zhou, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 173 days.

(21) Appl. No.: 15/056,402

(22) Filed: Feb. 29, 2016

(65) Prior Publication Data

US 2016/0179609 A1  Jun. 23, 2016

Related U.S. Application Data

(63) Continuation of application No. PCT/CN2014/070496, filed on Jan. 13, 2014.

(30) Foreign Application Priority Data

Aug. 27, 2013 (CN) .......................... 2013 1 0378406

(51) Int. Cl.
*G06F 11/00* (2006.01)
*G06F 11/07* (2006.01)
(Continued)

(52) U.S. Cl.
CPC ........ *G06F 11/0793* (2013.01); *G06F 3/0617* (2013.01); *G06F 3/0653* (2013.01);
(Continued)

(58) Field of Classification Search
CPC ............. G06F 11/0793; G06F 11/0727; G06F 11/0751; G06F 11/079; G06F 11/10;
(Continued)

(56) References Cited

U.S. PATENT DOCUMENTS

| 5,349,558 A | 9/1994 | Cleveland et al. |
| 5,974,544 A | 10/1999 | Jeffries et al. |

(Continued)

FOREIGN PATENT DOCUMENTS

| CN | 1831780 A | 9/2006 |
| CN | 101527171 A | 9/2009 |

(Continued)

OTHER PUBLICATIONS

Im, S., et al., "Flash-Aware RAID Techniques for Dependable and High-Performance Flash Memory SSD," IEEE Transactions on Computer, vol. 60, No. 1, Jan. 2011, pp. 80-92.

(Continued)

*Primary Examiner* — Bryce P Bonzo
*Assistant Examiner* — Anthony J Amoroso
(74) *Attorney, Agent, or Firm* — Conley Rose, P.C.

(57) ABSTRACT

A bad sector repair method includes receiving a first write operation instruction sent by a host, reading data of a physical page including the first sector according to a logical block address (LBA) of a first sector included in the first write operation instruction, allocating storage space with a same size as the physical page in a cache and setting data in the storage space to preset data when reading the data of the physical page fails, updating preset data of a storage area corresponding to the first sector and in the storage space with data that needs to be written to the first sector, and writing data in the storage space to the physical page to repair the first sector.

15 Claims, 4 Drawing Sheets

(51) Int. Cl.
 *G11C 29/44* (2006.01)
 *G11C 29/00* (2006.01)
 *G06F 3/06* (2006.01)
 *G06F 12/02* (2006.01)
 *G06F 11/10* (2006.01)
 *G06F 11/16* (2006.01)
 *G11C 7/00* (2006.01)

(52) U.S. Cl.
 CPC .......... *G06F 3/0659* (2013.01); *G06F 3/0679* (2013.01); *G06F 11/079* (2013.01); *G06F 11/0727* (2013.01); *G06F 11/0751* (2013.01); *G06F 11/10* (2013.01); *G06F 11/16* (2013.01); *G06F 12/0246* (2013.01); *G11C 7/00* (2013.01); *G11C 29/44* (2013.01); *G11C 29/82* (2013.01); *G06F 2212/1032* (2013.01); *G06F 2212/7203* (2013.01); *G06F 2212/7209* (2013.01)

(58) Field of Classification Search
 CPC .. G06F 11/16; G06F 11/1068; G06F 11/1072; G06F 3/0617; G06F 3/0653; G06F 3/0659; G06F 3/0679; G06F 12/0246; G06F 2212/1032; G06F 2212/7203; G06F 2212/7209; G06F 2211/1052; G11C 7/00; G11C 29/44; G11C 29/82
 See application file for complete search history.

(56) References Cited

U.S. PATENT DOCUMENTS

| | | | |
|---|---|---|---|
| 2004/0268179 A1* | 12/2004 | Stewart | G06F 11/2087 714/6.13 |
| 2006/0206751 A1 | 9/2006 | Honda | |
| 2009/0240871 A1* | 9/2009 | Yano | G06F 12/0246 711/103 |
| 2010/0042900 A1* | 2/2010 | Khmelnitsky | G06F 11/1072 714/764 |
| 2010/0122148 A1 | 5/2010 | Flynn et al. | |
| 2010/0274950 A1* | 10/2010 | Yano | G06F 12/0246 711/103 |
| 2013/0080858 A1 | 3/2013 | Lee et al. | |
| 2013/0097369 A1* | 4/2013 | Talagala | G06F 12/0246 711/103 |
| 2014/0298087 A1 | 10/2014 | Li | |

FOREIGN PATENT DOCUMENTS

| | | |
|---|---|---|
| CN | 101944386 A | 1/2011 |
| CN | 102193848 A | 9/2011 |
| CN | 102272731 A | 12/2011 |
| CN | 102708019 A | 10/2012 |
| CN | 103035294 A | 4/2013 |
| WO | 2004072815 A2 | 8/2004 |

OTHER PUBLICATIONS

Foreign Communication From a Counterpart Application, European Application No. 14840873.5, Extended European Search Report dated Jan. 12, 2017, 11 pages.

Foreign Communication From a Counterpart Application, Chinese Application No. 201310378406.9, Chinese Office Action dated Oct. 8, 2015, 5 pages.

Foreign Communication From a Counterpart Application, PCT Application No. PCT/CN2014/070496, English Translation of International Search Report dated Jun. 9, 2014, 2 pages.

Foreign Communication From a Counterpart Application, PCT Application No. PCT/CN2014/070496, English Translation of Written Opinion dated Jun. 9, 2014, 5 pages.

* cited by examiner

BAD SECTOR REPAIR METHOD AND APPARATUS

CROSS-REFERENCE TO RELATED APPLICATIONS

This application is a continuation of International Application No. PCT/CN2014/070496, filed on Jan. 13, 2014, which claims priority to Chinese Patent Application No. 201310378406.9 filed on Aug. 27, 2013, both of which are hereby incorporated by reference in their entireties.

TECHNICAL FIELD

The present disclosure relates to the computer field, and in particular, to a bad sector repair method and apparatus.

BACKGROUND

A hard disk is a main storage medium of a computer, and a solid state disk (SSD) is relatively common among hard disks. An SSD is a hard disk made of a solid state electronic storage chip array. The SSD stores data mainly using a flash chip as a storage medium. Currently, a relatively common flash chip is a negative and (NAND) flash. In a currently common NAND flash, each chip enable (CE) of the NAND flash is corresponding to 8192 blocks, and each block includes 128 pages, where a page is a minimum unit used when the NAND flash performs a read or write data operation, and a size of each page is generally 4096 (4K) byte (B). However, a minimum unit used when a host performs a read or write data operation on a hard disk is one sector, and a size of each sector is generally 512 B. It may be learned from the above that the minimum unit used when a host performs a read or write operation is inconsistent with the minimum unit used when a NAND flash performs a read or write data operation. When a host performs a write operation, if data that the host writes to a NAND flash is less than one page, the data can be successfully written to the NAND flash using a pre-padding solution.

It is known to all that a hard disk is vulnerable to a fault, and an uncorrectable error correcting code error (UNC) is one of most common faults. Currently, a redundant array of independent disks mechanism is usually used to resolve a UNC problem. When a UNC occurs in one of hard disks, data may be re-written, by reading information of another disk, to a location in which the UNC occurs, to achieve a repair objective. However, in a hard disk in which a NAND flash is used as a storage medium, a minimum unit used when a host performs a read or write data operation is one sector (for example, one sector is 512 B), while a minimum write unit of the NAND flash is one page (for example, one page is 4 KB). Therefore, a pre-padding solution needs to be used such that data can be successfully re-written to a location in which the UNC occurs, to perform repair. If the UNC occurs in an entire page, when the host performs repair in a unit of sector, and when the hard disk receives a write instruction from the host for a sector, a page in which the sector is located needs to be read into a random access memory (RAM). However, because the UNC occurs in the entire page, reading may fail. In this way, the hard disk may quit this write operation, and replies with writing success to the host. In this case, the host performs a read operation again on the sector, to determine whether a repair operation performed by the host on the sector is successful. The hard disk actually has not successfully write data to the sector. Therefore, the host fails to read and determines that a disk in which the sector is located is faulty (actually, the disk can still be used). Finally, the disk is removed, which causes redundant array of independent disks (RAID) degradation and affects system reliability.

SUMMARY

Embodiments of the present disclosure provide a bad sector repair method and apparatus, which resolve a problem that repair in a unit of sector is not successful when a UNC occurs in an entire page.

To achieve the foregoing objective, the following technical solutions are used in the embodiments of the present disclosure.

According to a first aspect, an embodiment of the present disclosure provides a bad sector repair method, including receiving, by a solid state disk, a first write operation instruction sent by a host, where the first write operation instruction includes a logical block address of a first sector and data that needs to be written to the first sector, reading, according to the logical block address (LBA) of the first sector, data of a physical page in which the first sector is located, wherein the storage space comprises at least two storage areas, allocating, in a cache, storage space with a same size as the physical page, and writing preset data in the storage space when reading the data of the physical page fails, wherein the storage space comprises at least two storage areas, each of the at least two storage areas corresponds to a sector of the physical page, updating, according to the LBA of the first sector, preset data of a storage area corresponding to the first sector and within the storage space with the data that needs to be written to the first sector, and writing the updated data in the storage space to a flash memory of the SSD to repair the first sector.

With reference to the first aspect, in a possible implementation manner, the method further includes setting a flag of each storage area in the storage space to a first flag after the allocating, in a cache, storage space with a same size as the physical page, where the first flag is used to indicate that data in the storage area is invalid data, and after the updating, according to the LBA of the first sector, preset data that is of a storage area corresponding to the first sector and in the storage space with the data that needs to be written to the first sector, the method further includes setting a flag of the storage area corresponding to the first sector to a second flag, where the second flag is used to indicate that data in the storage area is valid data, and writing the flag of each storage area in the storage space to redundant space of the physical page.

With reference to the first aspect and the foregoing possible implementation manner, in another possible implementation manner, after the writing data in the storage space to a flash memory of the SSD according to an address of the physical page, the method further includes receiving a second write operation instruction sent by the host, where the second write operation instruction includes an LBA of a second sector in the physical page and data that needs to be written to the second sector, reading the data of the physical page and a flag of each sector in the physical page into the cache according to the LBA of the second sector; updating preset data of the second sector with the data that needs to be written to the second sector according to the LBA of the second sector and setting a flag of the second sector to the second flag, and writing updated data of the physical page and the flag of each sector in the physical page to the flash memory of the SSD, to repair the second sector, where the flag of each sector in the physical page is written to the redundant space of the SSD.

With reference to the first aspect and the foregoing possible implementation manners, in another possible implementation manner, the method further includes receiving a read operation instruction sent by the host, where the read operation instruction includes an LBA of a to-be-read sector, acquiring a flag of the to-be-read sector according to the LBA of the to-be-read sector, and sending a response message to the host when the flag of the to-be-read sector is the first flag, where the response message is used to notify the host that data of the sector is invalid data.

With reference to the first aspect and the foregoing possible implementation manners, in another possible implementation manner, the method further includes reading the data of the sector when the flag of the to-be-read sector is the second flag, and sending the data of the sector to the host.

According to a second aspect, an embodiment of the present disclosure provides a bad sector repair apparatus, including a receiving module configured to receive a first write operation instruction sent by a host, where the first write operation instruction includes a logical block address of a first sector and data that needs to be written to the first sector, a reading module configured to read, according to the LBA of the first sector that is obtained by the receiving module, data of a physical page in which the first sector is located, wherein the storage space comprises at least two storage areas, a processing module configured to, allocate, in a cache, storage space with a same size as the physical page, and write preset data in the storage space when reading the data of the physical page by the reading module fails, wherein the storage space comprises at least two storage areas, each of the at least two storage areas corresponds to a sector of the physical page, an updating module configured to update, according to the LBA of the first sector obtained by the receiving module, preset data of a storage area corresponding to the first sector and in the storage space with the data that needs to be written to the first sector, and a writing module configured to write the updated data in the storage space to a flash memory of a SSD to repair the first sector.

With reference to the second aspect, in a possible implementation manner, the apparatus further includes a setting module configured to set a flag of each storage area in the storage space to a first flag after the processing module allocates, in a cache, storage space with a same size as the physical page, where the first flag is used to indicate that data in the storage area is invalid data, the setting module is further configured to set a flag of the storage area corresponding to the first sector to a second flag after the updating module updates, according to the LBA of the first sector, the preset data that is of the storage area corresponding to the first sector and in the storage space with the data that needs to be written to the first sector, where the second flag is used to indicate that data in the storage area is valid data, and the writing module is further configured to write the flag of each storage area in the storage space to redundant space of the SSD.

With reference to the second aspect and the foregoing possible implementation manner, in another possible implementation manner, the receiving module is further configured to, after the writing module writes the data in the storage space to the flash memory of the SSD according to the address of the physical page, receive a second write operation instruction sent by the host, where the second write operation instruction includes an LBA of a second sector in the physical page and data that needs to be written to the second sector, the reading module is further configured to read the data of the physical page and a flag of each sector in the physical page into the cache according to the LBA of the second sector that is obtained by the receiving module, the processing module is further configured to update preset data of the second sector with the data that needs to be written to the second sector according to the LBA of the second sector that is obtained by the receiving module and set a flag of the second sector to the second flag, and the writing module is further configured to write updated data of the physical page and the flag of each sector in the physical page to the flash memory of the SSD, to complete repair on the second sector, where the flag of each sector in the physical page is written to the redundant space of the SSD.

With reference to the second aspect and the foregoing possible implementation manners, in another possible implementation manner, the receiving module is further configured to receive a read operation instruction sent by the host, where the read operation instruction includes an LBA of a to-be-read sector, and the apparatus further includes an acquiring module configured to acquire a flag of the to-be-read sector according to the LBA of the to-be-read sector that is obtained by the receiving module, and a sending module configured to send a response message to the host when the flag of the to-be-read sector that is obtained by the acquiring module is the first flag, where the response message is used to notify the host that data of the sector is invalid data.

With reference to the second aspect and the foregoing possible implementation manners, in another possible implementation manner, the reading module is further configured to read the data of the sector, and send the data of the sector to the host when the flag of the to-be-read sector that is obtained by the acquiring module is the second flag.

According to a third aspect, an embodiment of the present disclosure provides a bad sector repair apparatus, including a bus interface configured to receive a first write operation instruction sent by a host, where the first write operation instruction includes an LBA of a first sector and data that needs to be written to the first sector and a processor configured to receive a first write operation instruction sent by a host, wherein the first write operation instruction comprises a LBA of a first sector and data that needs to be written to the first sector; read, according to the LBA of the first sector, data of a physical page in which the first sector is located, wherein the storage space comprises at least two storage areas, allocate, in a cache, storage space with a same size as the physical page, and writing preset data in the storage space when reading the data of the physical page fails, wherein the storage space comprises at least two storage areas, each of the at least two storage areas corresponds to a sector of the physical page, update, according to the LBA of the first sector, preset data of a storage area corresponding to the first sector and within the storage space with the data that needs to be written to the first sector, and write the updated data in the storage space to a flash memory of a SSD to repair the first sector.

With reference to the second aspect, in a possible implementation manner, the processer is further configured to set a flag of each storage area in the storage space to a first flag after the processor allocates, in a cache, storage space with a same size as the physical page, wherein the first flag is used to indicate that data in the storage area is invalid data, set a flag of the storage area corresponding to the first sector to a second flag after the processor updates, according to the LBA of the first sector, preset data of a storage area corresponding to the first sector and within the storage space with the data that needs to be written to the first sector, wherein the second flag is used to indicate that data in the storage area is valid data, and write the flag of each storage area in the storage space to redundant space of the physical page.

With reference to the third aspect and the foregoing possible implementation manners, in another possible implementation manner the processor is further configured to receive a second write operation instruction sent by the host after the processor writes data in the storage space to a flash memory of the SSD according to an address of the physical page, wherein the second write operation instruction comprises an LBA of a second sector in the physical page and data that needs to be written to the second sector, read the data of the physical page and a flag of each sector in the physical page into the cache according to the LBA of the second sector, update preset data of the second sector with the data that needs to be written to the second sector according to the LBA of the second sector and setting a flag of the second sector to the second flag, and write updated data of the physical page and the flag of each sector in the physical page to the flash memory of the SSD to repair the second sector, wherein the flag of each sector in the physical page is written to the redundant space of the SSD.

With reference to the third aspect and the foregoing possible implementation manners, in another possible implementation manner, the processor is further configured to receive a read operation instruction sent by the host, wherein the read operation instruction comprises an LBA of a to-be-read sector, acquire a flag of the to-be-read sector according to the LBA of the to-be-read sector, and send a response message to the host when the flag of the to-be-read sector is the first flag, wherein the response message is used to notify the host that data of the sector is invalid data.

With reference to the third aspect and the foregoing possible implementation manners, in another possible implementation manner, the processor is further configured to read the data of the sector when the flag of the to-be-read sector is the second flag, and sending the data of the sector to the host. According to the bad sector repair method and apparatus provided in the embodiments of the present disclosure, when an SSD fails to read data of a physical page including a first sector according to an LBA of the first sector included in a received first write operation instruction sent by a host, storage space with a same size as the physical page is allocated in a cache, and preset data is written to the storage space, preset data of a storage area corresponding to the first sector and in the storage space is then updated with data that needs to be written to the first sector, and finally, data in the storage space is written to the physical page. Therefore, an entire page occurring UNC can be repaired in one sector each time.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other accompanying drawings according to these drawings without creative efforts.

DESCRIPTION OF EMBODIMENTS

The following clearly and describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

In the prior art, when a host performs repair in a unit of sector, if an SSD receives a write instruction from the host for a sector, a page in which the sector is located needs to be read into a RAM. However, because a UNC occurs in the page, reading fails. In this case, the sector cannot be successfully repaired, and the host removes a disk including the page, which causes RAID degradation and finally affects system reliability.

To overcome the defect in the prior art, the embodiments of the present disclosure provide a bad sector repair method and apparatus. For details, refer to the following Embodiment 1 to Embodiment 4.

Embodiment 1

Figure 1:
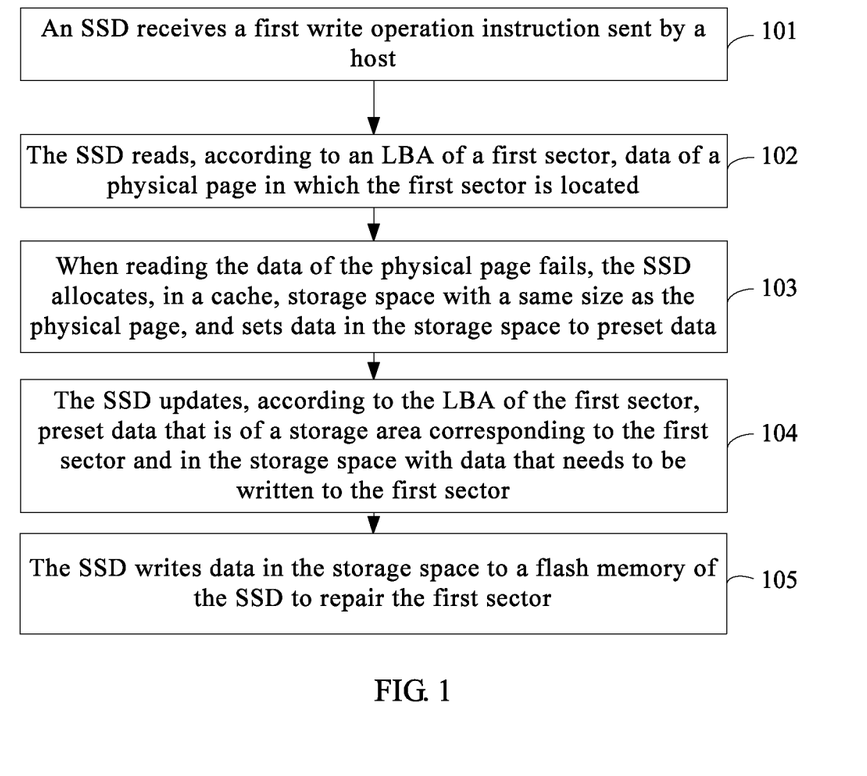
FIG. 1 is a flowchart of a bad sector repair method according to Embodiment 1 of the present disclosure.

Embodiment 1 of the present disclosure provides a bad sector repair method. As shown in FIG. 1, the method may include the following steps.

Step 101: An SSD receives a first write operation instruction sent by a host.

When a UNC occurs in an entire physical page in the SSD, and the host needs to perform, in a unit of single sector, repair on the physical page in which the UNC occurs, the host may write data to a sector in the physical page. Further, the host may send the first write operation instruction to the SSD. In this case, the SSD receives the first write operation instruction sent by the host, where the first write operation instruction includes a LBA of a first sector and data that needs to be written to the first sector and is corresponding to the LBA of the first sector, and the first sector is any one of sectors included in the physical page in which the UNC occurs.

Step 102: The SSD reads, according to the LBA of the first sector, data of a physical page in which the first sector is located.

After receiving the first write operation instruction sent by the host, the SSD may acquire, according to the LBA of the first sector that is included in the received first write operation instruction, an address of the physical page in which the first sector is located, and performs a read operation on the data of the physical page according to the address of the physical page.

Step 103: When reading the data of the physical page fails, the SSD allocates, in a cache, storage space with a same size as the physical page, and sets data in the storage space to preset data.

When the SSD performs, according to the LBA of the first sector that is included in the received first write operation instruction, the read operation on the data of the physical page in which the first sector is located, reading the data of the physical page fails. In this case, the SSD may directly allocate, in the cache, the storage space with the same size as the physical page, and sets the data in the storage space to the preset data. For example, if the preset data is 0, the SSD sets, in the cache, the data in the storage space with the same size as the physical page to 0.

It should be noted that, in this embodiment of the present disclosure, the preset data is special data that can be distinguished from common data, and a specific value of the preset data is not limited herein in this embodiment of the present disclosure.

It should be noted that, in this embodiment of the present disclosure, the cache may be a memory, such as a RAM or a read only memory (ROM) in the SSD, which is not limited in this embodiment of the present disclosure.

Step 104: The SSD updates, according to the LBA of the first sector, preset data that is of a storage area corresponding to the first sector and in the storage space with data that needs to be written to the first sector.

After allocating, in the cache, the storage space with the same size as the physical page, and setting the data in the storage space to the preset data, the SSD may update, according to the LBA of the first sector that is included in the received first write operation instruction sent by the host, the preset data that is of the storage area corresponding to the first sector and in the storage space with the data that needs to be written to the first sector.

Step 105: The SSD writes the data in the storage space to a flash memory of the SSD according to the address of the physical page, to repair the first sector.

After updating, according to the LBA of the first sector, the preset data that is of the storage area corresponding to the first sector and in the storage space with the data that needs to be written to the first sector, the SSD may write the data in the storage space to the flash memory of the SSD according to the address of the physical page, to overwrite original data in the physical page. In this case, repair on the first sector is completed.

According to the bad sector repair method provided in this embodiment of the present disclosure, an SSD reads, according to an LBA of a first sector that is included in a received first write operation instruction sent by a host, data of a physical page in which the first sector is located, when reading the data of the physical page fails, storage space with a same size as the physical page is allocated in a cache, and data in the storage space is set to preset data, preset data that is of a storage area corresponding to the first sector and in the storage space is then updated, according to the LBA of the first sector, with data that needs to be written to the first sector, and finally, data in the storage space is written to a flash memory of the SSD according to an address of the physical page. The data of the storage space, namely allocated in the cache and has the same size as the physical page is set to the preset data, the preset data of the storage area corresponding to the first sector is updated with the data that needs to be written to the first sector, and updated data of the storage space is written to the flash memory of the SSD to replace original data of a physical page in which a UNC occurs, which resolves a problem that repair in a unit of sector is not successful when a UNC occurs in an entire page.

Embodiment 2

Figure 2:
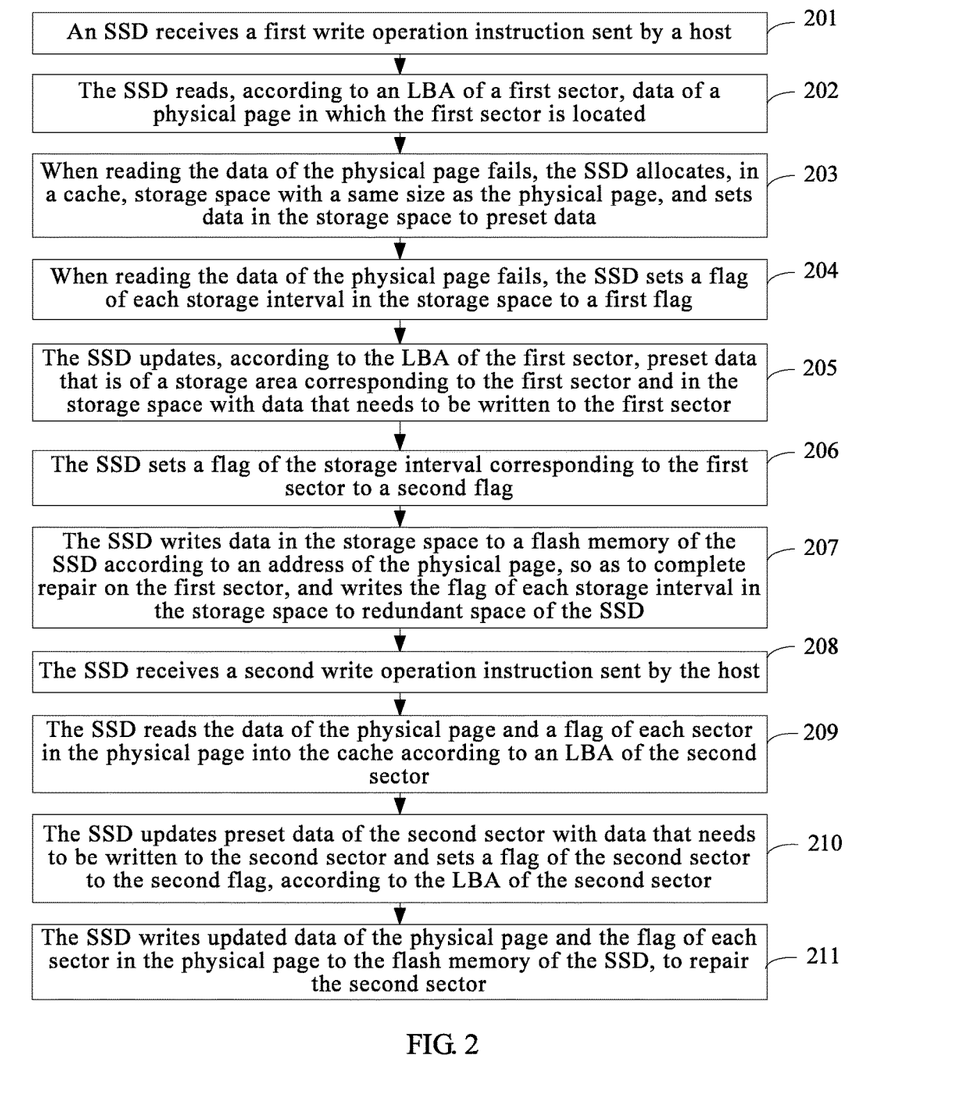
FIG. 2 is a flowchart of a bad sector repair method according to Embodiment 2 of the present disclosure.

Embodiment 2 of the present disclosure provides a bad sector repair method. As shown in FIG. 2, the method may include the following steps.

Step 201: An SSD receives a first write operation instruction sent by a host.

When a UNC occurs in an entire physical page in the SSD, and the host needs to perform, in a unit of single sector, repair on the physical page in which the UNC occurs, the host may write data to a sector in the physical page. Furthermore, the host may send the first write operation instruction to the SSD. In this case, the SSD may receive the first write operation instruction sent by the host, where the first write operation instruction includes an LBA of a first sector and data that needs to be written to the first sector and is corresponding to the LBA of the first sector, and the first sector is any one of sectors included in the physical page in which the UNC occurs.

Step 202: The SSD reads, according to the LBA of the first sector, data of a physical page in which the first sector is located.

After receiving the first write operation instruction sent by the host, the SSD may acquire, according to the LBA of the first sector that is included in the received first write operation instruction, an address of the physical page in which the first sector is located, and performs a read operation on the data of the physical page according to the address of the physical page.

Step 203: When reading the data of the physical page fails, the SSD allocates, in a cache, storage space with a same size as the physical page, and sets data in the storage space to preset data.

When reading the data of the physical page by the SSD fails, the SSD allocates, in the cache, the storage space with the same size as the physical page, and sets the data in the storage space to the preset data. The storage space includes at least two storage areas, and each of the storage areas is corresponding to one sector in the physical page. In other words, setting the data in the storage space to the preset data is further setting data of each storage area included in the storage space to the preset data.

It should be noted that, in this embodiment of the present disclosure, the preset data is special data that can be distinguished from common data, and a specific value of the preset data is not limited herein in this embodiment of the present disclosure.

Step 204: When reading the data of the physical page fails, the SSD sets a flag of each storage area in the storage space to a first flag.

The storage space includes at least two storage areas, and each of the storage areas is corresponding to one sector in the physical page. To distinguish whether data of each storage area in the storage space is valid data, in this embodiment of the present disclosure, the SSD sets a flag for each storage area included in the storage space. Furthermore, the SSD may set the flag of each storage area in the storage space to the first flag if reading the data of the physical page by the SSD fails, where the flag of each storage area is used to indicate whether data of a corresponding storage area is valid, and the first flag is used to indicate that data of the corresponding storage area is invalid data.

It should be noted that, in step 202, the read operation is performed, according to the LBA of the first sector, on the data of the physical page in which the first sector is located, if reading the data of the physical page fails, step 203 may be first executed, and then step 204 is executed, or step 204 may be first executed, and then step 203 is executed, or step 203 and step 204 may be executed at the same time after reading the data of the physical page fails. In other words, an execution order of step 203 and step 204 is not limited in this embodiment of the present disclosure, and generally, step 203 and step 204 may be executed at the same time.

Step 205: The SSD updates, according to the LBA of the first sector, preset data that is of a storage area corresponding to the first sector and in the storage space with data that needs to be written to the first sector.

After setting the data of the storage space allocated in the cache and with the same size as the physical page to the preset data, and setting the flag of each storage area in the storage space to the first flag, the SSD may update, according to the LBA of the first sector that is included in the received first write operation instruction, the preset data that is of the storage area corresponding to the first sector and in the storage space with the data that needs to be written to the first sector. In this case, the data of the storage area corresponding to the first sector and in the storage space is data of the first sector in the physical page to be repaired.

Step 206: The SSD sets a flag of the storage interval corresponding to the first sector to a second flag.

The data that is of the storage area corresponding to the first sector and in the storage space is already the data that needs to be written to the first sector. Therefore, the SSD needs to change a valid flag that is of the storage area corresponding to the first sector and in the storage space from the first flag to the second flag, where the second flag is used to indicate that the data of the storage area is valid data.

It should be noted that there is no execution order of step 205 and step 206, and generally, the step 205 and step 206 can be executed at the same time. This embodiment of the present disclosure imposes no limitation on the execution order of step 205 and step 206.

Step 207: The SSD writes data in the storage space to a flash memory of the SSD according to an address of the physical page in order to complete repair on the first sector, and writes the flag of each storage interval in the storage space to redundant space of the SSD.

After the SSD updates, according to the LBA of the first sector, the preset data of the storage area corresponding to the first sector and in the storage space with the data that needs to be written to the first sector, and sets the flag of the storage area corresponding to the first sector to the second flag, the SSD writes, according to the address of the physical page, data in the storage space to the flash memory of the SSD to replace original data of the physical page, to complete repair on the first sector, and writes the flag of each storage area in the storage space to the redundant space of the SSD. It is known to all that, each physical page in a NAND flash has redundant space. In this embodiment of the present disclosure, the flag of each storage area in the storage space may be written to the redundant space of a physical page. In this way, no entry is added to a system, space of a RAM is saved, and a cost is saved. For example, an SSD uses a NAND flash as a storage medium, a minimum unit used when a host performs a data read or write operation is one sector, a size of each sector is 512 B, and a size of space for actually storing data that a physical page provided to an external device except the SSD is eight sectors (8*512 B=4096 B). However, for the SSD, a size of a physical page is actually larger than a size of eight sectors. For example, a size of the physical page may be, for example, 4120 B, which is larger than 4096 B. In this case, redundant space may be used to store a flag of each storage area in storage space, that is, a flag corresponding to each sector included in the physical page.

It may be understood that, a storage area included in the storage space is corresponding to a sector in the physical page. Therefore, after the SSD writes the data in the storage space to the flash memory of the SSD according to the address of the physical page, and writes the flag of each storage area in the storage space to the redundant space of the SSD, the flag of each storage area in the storage space is a flag of each sector in the physical page. That is, the flag indicates whether data of each sector in the physical page is valid data.

After the SSD writes the data in the storage space to the flash memory of the SSD and writes the flag of each storage area in the storage space to the redundant space of the SSD, according to the address of the physical page, in an application scenario, if the host needs to perform repair on data of a second sector in the physical page in which the UNC occurs, the following step 208 to step 211 may be executed.

Step 208: The SSD receives a second write operation instruction sent by the host.

When the host needs to repair the data of the second sector, the host may send the second write operation instruction to the SSD. In this case, the SSD may receive the second write operation instruction sent by the host. The second write operation instruction includes an LBA of the second sector in the physical page and data that needs to be written to the second sector and is corresponding to the LBA of the second sector, and the second sector is any sector in at least two sectors included in the physical page except the first sector.

Step 209: The SSD reads the data of the physical page and a flag of each sector in the physical page into the cache according to the LBA of the second sector.

After receiving the second write operation instruction sent by the host, the SSD may read the data of the physical page in which the second sector is located and the flag of each sector in the physical page into the cache according to the LBA of the second sector that is included in the second write operation instruction.

Step 210: The SSD updates preset data of the second sector with data that needs to be written to the second sector and sets a flag of the second sector to the second flag, according to the LBA of the second sector.

After reading the data of the physical page and the flag of each sector in the physical page into the cache according to the LBA of the second sector, the SSD may update, according to the LBA of the second sector that is included in the second write operation instruction, the preset data of the second sector with the data that needs to be written to the second sector to overwrite original data of the second sector. In addition, the SSD needs to set the flag corresponding to the second sector to the second flag, to indicate that data of the second sector is valid data.

Step 211: The SSD writes updated data of the physical page and the flag of each sector in the physical page to the flash memory of the SSD, to complete repair on the second sector.

After updating, according to the LBA of the second sector, the preset data of the second sector with the data that needs to be written to the second sector, and setting the flag of the second sector to the second flag, the SSD may write the updated data of the physical page and the flag of each sector in the physical page to the flash memory of the SSD. In this case, repair on the data of the second sector in the physical page is completed, and the flag of each sector in the physical page is written to the redundant space of the SSD.

It should be noted that repair on all sectors in the entire physical page may be completed by repeating execution of step 208 to step 211.

Figure 3:
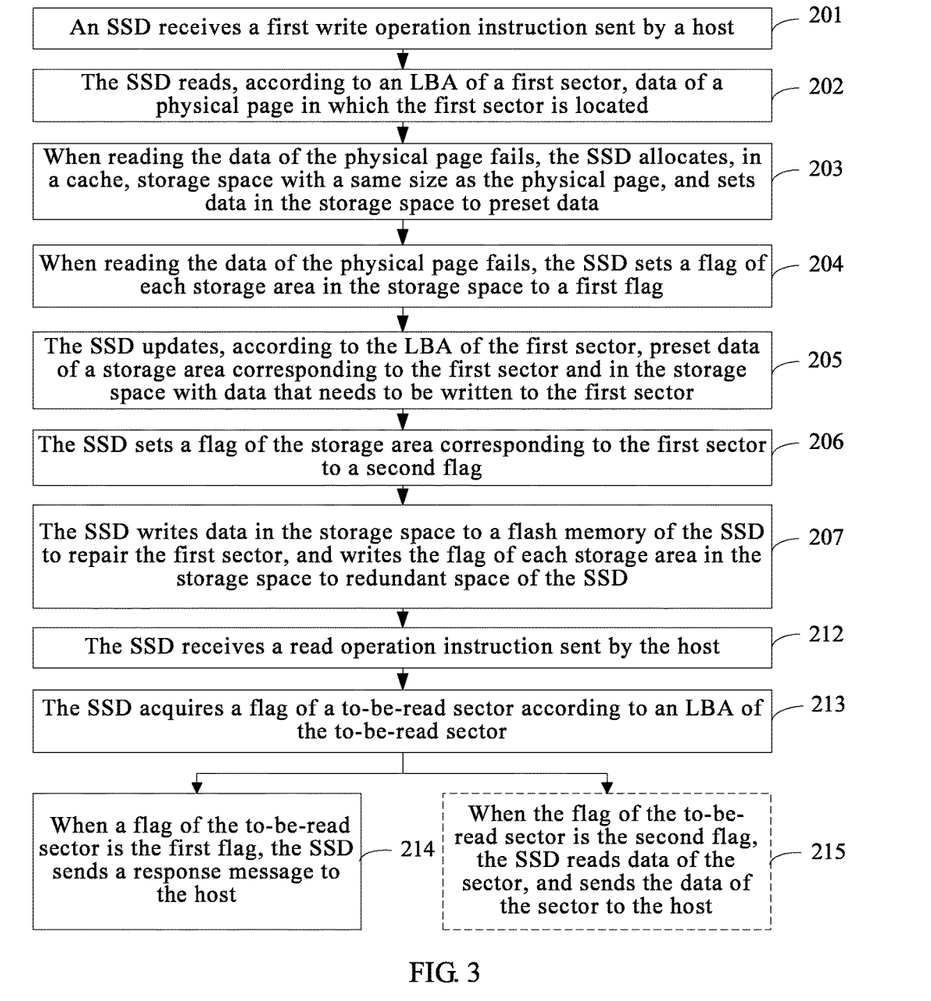
FIG. 3 is a flowchart of another bad sector repair method according to Embodiment 2 of the present disclosure.

After the SSD writes, according to the address of the physical page, the data in the storage space to the flash memory of the SSD and writes the flag of each storage area in the storage space to the redundant space of the SSD, in another application scenario, as shown in FIG. 3, if the host needs to read data of a sector in the physical page, the following step 212 to step 215 may be executed.

Step 212: The SSD receives a read operation instruction sent by the host.

When the host needs to read data of a sector in the physical page, the host may send the read operation instruction to the SSD. In this case, the SSD may receive the read operation instruction sent by the host, where the read operation instruction includes an LBA of the to-be-read sector.

Step 213: The SSD acquires a flag of a to-be-read sector according to an LBA of the to-be-read sector.

After receiving the read operation instruction sent by the host, the SSD may acquire the flag of the to-be-read sector according to the LBA of the to-be-read sector that is included in the read operation instruction.

Step 214: When the flag of the to-be-read sector is the first flag, the SSD sends a response message to the host.

After acquiring the flag of the to-be-read sector according to the LBA of the to-be-read sector, the SSD needs to perform determining on the flag of the to-be-read sector. When it is determined that the flag of the to-be-read sector is the first flag, it indicates that data of the to-be-read sector is invalid data. In this case, the SSD may send the response message to the host, where the response message is used to notify the host that the data of the to-be-read sector is invalid data.

Optionally, after receiving the read operation instruction sent by the host, the SSD may directly read data of the corresponding sector according to the LBA of the to-be-read sector that is included in the read operation instruction. After reading the data of the to-be-read sector, the SSD determines whether the obtained data of the to-be-read sector is the preset data, and when determining that the obtained data of the to-be-read sector is the preset data, the SSD sends, to the host, the response message that is used to notify the host that the data of the to-be-read sector is invalid data.

Step 215: When the flag of the to-be-read sector is the second flag, the SSD reads the data of the sector, and sends the data of the sector to the host.

After the SSD acquires the flag of the to-be-read sector according to the LBA of the to-be-read sector, when the SSD determines that the flag of the to-be-read sector is the second flag, it indicates that the data of the to-be-read sector is valid data. In this case, the SSD may read the data of the sector, and send the data of the sector to the host.

Optionally, after receiving the read operation instruction sent by the host, the SSD may directly read the data of the to-be-read sector according to the LBA of the to-be-read sector that is included in the read operation instruction, after obtaining the data of the to-be-read sector, the SSD determines whether the obtained data of the to-be-read sector is the preset data, and when determining that the obtained data of the to-be-read sector is not the preset data, the SSD sends the read data of the to-be-read sector to the host.

It should be noted that, in this embodiment of the present disclosure, the cache may be a memory, such as a RAM or a ROM in the SSD, which is not limited in this embodiment of the present disclosure.

To facilitate understanding by a person skilled in the art, an implementation process in this embodiment of the present disclosure is exemplarily illustrated.

For example, an SSD uses a NAND flash as a storage medium, a size of a physical page is 4 KB, a minimum unit used when a host performs a data read or write operation is one sector, and a size of each sector is 512 B. In other words, one physical page includes eight sectors, and preset data is 0, a first flag is 1, and a second flag is 0. When a UNC occurs in the entire physical page, the host needs to restore data of a sector 2 in the physical page, and may send a write operation instruction to the SSD, where the write operation instruction includes an LBA of the sector 2 and data that needs to be written to the sector 2 and is corresponding to the LBA of the sector 2. After receiving the write operation instruction, the SSD may acquire, according to the LBA of the sector 2, an address of the physical page in which the sector 2 is located, and reads data of the physical page (the physical page includes eight sectors) according to the address of the physical page. When reading the data of the physical page fails, the SSD allocates, in a cache (for example, a RAM), storage space (the storage space includes eight storage areas, and a size of each storage area is the same as a size of the sector) with a same size as the physical page, sets data of the eight storage areas included in the storage space to 0, and sets flags of the eight storage areas in the storage space to 1. In this case, the SSD may overwrite existing data of the sector 2 with the data that needs to be written to the sector 2 and is corresponding to the LBA of the sector 2, where the LBA of the sector 2 is included in the write operation instruction, changes a flag of a storage area corresponding to the sector2 to 0, and finally, writes data in the storage space to a flash memory of the SSD and writes the flags of the eight storage areas in the storage space to the redundant space of the SSD, according to the address of the physical page.

After the data in the storage space is written to the flash memory of the SSD, and the flags of the eight storage areas in the storage space are written to the redundant space of the SSD, if the SSD can acquire a flag of the sector 2 according to the LBA of the sector 2 in the read operation instruction when receiving a read operation instruction that is used to read the data of the sector 2 and is sent by the host, and then determine that the obtained flag of the sector 2 is a second flag, the SSD may read the data of the sector 2 and send the data of the sector 2 to the host. If the SSD can acquire a flag of the sector according to an LBA of the sector in the read operation instruction when receiving a read operation instruction that is used to read data of another sector except the sector 2 and is sent by the host, the SSD sends, to the host when determining that the obtained flag of the sector is the first flag, a response message that is used to notify the host that data of the sector that needs to be read is invalid data.

After the data in the storage space is written to the flash memory of the SSD, and the flags of the eight storage areas in the storage space are written to the redundant space of the SSD, if the host needs to restore data of a sector except the sector 2, the host may send a write operation instruction for writing data to the sector except the sector 2 to the SSD. In this case, the SSD may acquire, according to an LBA of the sector that is included in the write operation instruction, data in a physical page and valid flags corresponding to eight sectors included in the physical page, reads the data of the physical page and the valid flags corresponding to the eight sectors into a cache, updates, according to the write operation instruction of the sector, data of the sector included in the physical page, sets a valid flag corresponding to the sector to the second flag; and finally, writes updated data of the physical page and a flag of each sector in the physical page to the flash memory of the SSD, to complete repair on the sector. Repair on all sectors in the entire physical page may be completed by repeating the process.

According to the bad sector repair method provided in this embodiment of the present disclosure, an SSD reads, according to an LBA of a first sector that is included in a received first write operation instruction sent by a host, data of a physical page in which the first sector is located. When reading the data of the physical page fails, storage space with a same size as the physical page is allocated in a cache, and data in the storage space is set to preset data. Preset data that is of a storage area corresponding to the first sector and in the storage space is then updated, according to the LBA of the first sector, with data that needs to be written to the first sector, and finally, data in the storage space is written to a flash memory of the SSD according to an address of the physical page. The data of the storage space allocated in the cache and with the same size as the physical page is set to the preset data, the preset data of the storage area corresponding to the first sector is updated with the data that needs to be written to the first sector, and updated data of the storage space is written to the flash memory of the SSD to replace original data of a physical page in which a UNC occurs, which resolves a problem that repair in a unit of sector is not successful when a UNC occurs in an entire page.

In addition, by setting a valid flag for each sector in the page, the entire page generating UNC is gradually repaired in a unit of sector to improve flexibility of the system while no table is added in the system.

Embodiment 3

Figure 4:
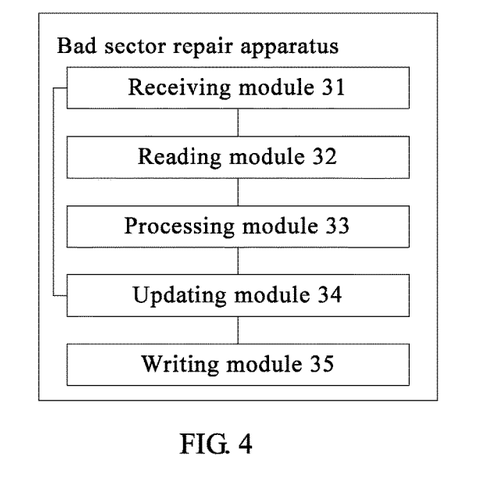
FIG. 4 is a schematic structural diagram of a bad sector repair apparatus according to Embodiment 3 of the present disclosure.

Embodiment 3 of the present disclosure provides a bad sector repair apparatus, which, as shown in FIG. 4, includes a receiving module 31, a reading module 32, a processing module 33, an updating module 34, and a writing module 35.

The receiving module 31 is configured to receive a first write operation instruction sent by a host, where the first write operation instruction includes an LBA of a first sector and data that needs to be written to the first sector.

The reading module 32 is configured to read, according to the LBA of the first sector that is obtained by the receiving module 31, data of a physical page in which the first sector is located.

The processing module 33 is configured to, when reading the data of the physical page by the reading module 32 fails, allocate, in a cache, storage space with a same size as the physical page, and set data in the storage space to preset data.

The updating module 34 is configured to update, according to the LBA of the first sector that is obtained by the receiving module 31, preset data that is of a storage area corresponding to the first sector and in the storage space with the data that needs to be written to the first sector.

The writing module 35 is configured to write data in the storage space to a flash memory of an SSD according to an address of the physical page, to complete repair on the first sector.

Further, the storage space includes at least two storage areas, and each of the storage areas is corresponding to one sector in the physical page.

Figure 5:
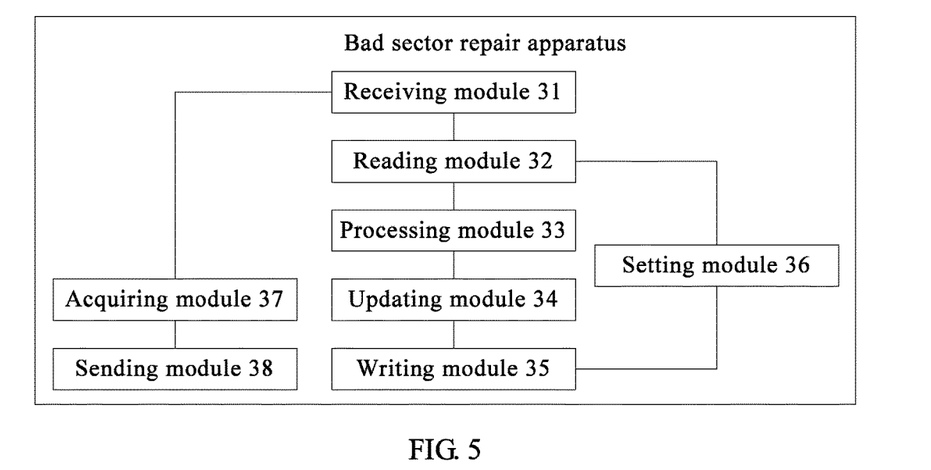
FIG. 5 is a schematic composition diagram of another bad sector repair apparatus according to Embodiment 3 of the present disclosure.

As shown in FIG. 5, the apparatus may further include a setting module 36.

The setting module 36 is configured to set a flag of each storage area in the storage space to a first flag when reading the data of the physical page by the reading module 32 fails, where the first flag is used to indicate that data in the storage area is invalid data.

The setting module 36 is further configured to set a flag of the storage area corresponding to the first sector to a second flag after the updating module 34 updates, according to the LBA of the first sector, the preset data that is of the storage area corresponding to the first sector and in the storage space with the data that needs to be written to the first sector, where the second flag is used to indicate that data in the storage area is valid data.

The writing module 35 is further configured to write the flag of each storage area in the storage space to redundant space of the SSD.

Further, the receiving module 31 is further configured to, after the writing module 35 writes the data in the storage space to the flash memory of the SSD according to the address of the physical page, receive a second write operation instruction sent by the host, where the second write operation instruction includes an LBA of a second sector in the physical page and data that needs to be written to the second sector.

The reading module 32 is further configured to read the data of the physical page and a flag of each sector in the physical page into the cache according to the LBA of the second sector that is obtained by the receiving module 31.

The processing module 33 is further configured to update preset data of the second sector with the data that needs to be written to the second sector and set a flag of the second sector to the second flag, according to the LBA of the second sector that is obtained by the receiving module 31.

The writing module 35 is further configured to write updated data of the physical page and the flag of each sector in the physical page to the flash memory of the SSD, to complete repair on the second sector, where the flag of each sector in the physical page is written to the redundant space of the SSD.

The receiving module 31 is further configured to receive a read operation instruction sent by the host, where the read operation instruction includes an LBA of a to-be-read sector.

The apparatus further includes an acquiring module 37 and a sending module 38.

The acquiring module 37 is configured to acquire a flag of the to-be-read sector according to the LBA of the to-be-read sector that is obtained by the receiving module 31.

The sending module 38 is configured to, when the flag of the to-be-read sector that is obtained by the acquiring module 37 is the first flag, send a response message to the host, where the response message is used to notify the host that data of the sector is invalid data.

The reading module 32 is further configured to, when the flag of the to-be-read sector that is obtained by the acquiring module 37 is the second flag, read the data of the sector, and send the data of the sector to the host.

It should be noted that, for specific descriptions of function modules in the bad sector repair apparatus provided in this embodiment of the present disclosure, refer to specific descriptions of corresponding content in the method embodiments, and details are not described again in this embodiment of the present disclosure.

According to the bad sector repair apparatus provided in this embodiment of the present disclosure, data of a physical page in which a first sector is located is read according to an LBA of the first sector that is included in a received first write operation instruction sent by a host. When reading the data of the physical page fails, storage space with a same size as the physical page is allocated in a cache, and data in the storage space is set to preset data. Preset data that is of a storage area corresponding to the first sector and in the storage space is then updated, according to the LBA of the first sector, with data that needs to be written to the first sector, and finally, data in the storage space is written to a flash memory of an SSD according to an address of the physical page. The data of the storage space allocated in the cache and with the same size as the physical page is set to the preset data, the preset data of the storage area corresponding to the first sector is updated with the data that needs to be written to the first sector, and updated data of the storage space is written to the flash memory of the SSD to replace original data of a physical page in which a UNC occurs, which resolves a problem that repair in a unit of sector is not successful when a UNC occurs in an entire page.

In addition, a valid flag corresponding to each sector in the page is set. Therefore, in a case in which no entry is added for a system, it is implemented that a UNC problem that occurs in the entire page is gradually repaired in a unit of sector, and flexibility of the system is improved.

Embodiment 4

Figure 6:
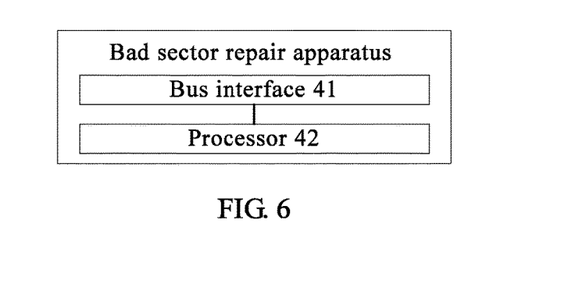
FIG. 6 is a schematic composition diagram of a bad sector repair apparatus according to Embodiment 4 of the present disclosure.

Embodiment 4 of the present disclosure provides a bad sector repair apparatus, which, as shown in FIG. 6, includes a bus interface 41 and a processor 42, where the bus interface 41 is configured to communicate with an external device.

The bus interface 41 is configured to receive a first write operation instruction sent by a host, where the first write operation instruction includes an LBA of a first sector and data that needs to be written to the first sector.

The processor 42 is configured to read, according to the LBA of the first sector that is obtained by the bus interface 41, data of a physical page in which the first sector is located.

The processor 42 is further configured to, when reading the data of the physical page fails, allocate, in a cache, storage space with a same size as the physical page, and set data in the storage space to preset data.

The processor 42 is further configured to update, according to the LBA of the first sector that is obtained by the bus interface 41, preset data that is of a storage area corresponding to the first sector and in the storage space with the data that needs to be written to the first sector.

The processor 42 is further configured to write data in the storage space to a flash memory of an SSD according to an address of the physical page, to complete repair on the first sector.

In this embodiment of the present disclosure, further, optionally, the storage space includes at least two storage areas, and each of the storage areas is corresponding to one sector in the physical page.

The processor 42 is further configured to, when reading the data of the physical page fails, set a flag of each storage area in the storage space to a first flag, where the first flag is used to indicate that data in the storage area is invalid data.

The processor 42 is further configured to set the flag of the storage area corresponding to the first sector to a second flag after the preset data that is of the storage area corresponding to the first sector and in the storage space is updated, according to the LBA of the first sector, with the data that needs to be written to the first sector, where the second flag is used to indicate that data in the storage area is valid data.

The processor 42 is further configured to write the flag of each storage area in the storage space to redundant space of the SSD.

In this embodiment of the present disclosure, further, optionally, the bus interface 41 is further configured to, after the data in the storage space is written to the flash memory of the SSD according to the address of the physical page, receive a second write operation instruction sent by the host, where the second write operation instruction includes an LBA of a second sector in the physical page and data that needs to be written to the second sector.

The processor 42 is further configured to read the data of the physical page and a flag of each sector in the physical page into the cache according to the LBA of the second sector that is obtained by the bus interface 41.

The processor 42 is further configured to, update preset data of the second sector with the data that needs to be written to the second sector and set a flag of the second sector to the second flag, according to the LBA of the second sector that is obtained by the bus interface 41.

The processor 42 is further configured to write updated data of the physical page and the flag of each sector in the physical page to the flash memory of the SSD, to complete repair on the second sector, where the flag of each sector in the physical page is written to the redundant space of the SSD.

In this embodiment of the present disclosure, optionally, the bus interface 41 is further configured to receive a read operation instruction sent by the host, where the read operation instruction includes an LBA of a to-be-read sector.

The processor 42 is further configured to acquire a flag of the to-be-read sector according to the LBA of the to-be-read sector that is obtained by the receiving module 41.

The processor 42 is further configured to, when the flag of the to-be-read sector is the first flag, send a response message to the host, where the response message is used to notify the host that data of the sector is invalid data.

In this embodiment of the present disclosure, further, optionally, the processor 42 is further configured to, when the flag of the to-be-read sector is the second flag, read the data of the sector, and send the data of the sector to the host.

It should be noted that, for specific descriptions of function modules in the bad sector repair apparatus provided in this embodiment of the present disclosure, refer to specific descriptions of corresponding content in the method embodiments, and details are not described again in this embodiment of the present disclosure.

According to the bad sector repair apparatus provided in this embodiment of the present disclosure, data of a physical page in which a first sector is located is read according to an LBA of the first sector that is included in a received first write operation instruction sent by a host. When reading the data of the physical page fails, storage space with a same size as the physical page is allocated in a cache, and data in the storage space is set to preset data. Preset data that is of a storage area corresponding to the first sector and in the storage space is then updated, according to the LBA of the first sector, with data that needs to be written to the first sector, and finally, data in the storage space is written to a flash memory of an SSD according to an address of the physical page. The data of the storage space allocated in the cache and with the same size as the physical page is set to the preset data, the preset data of the storage area corresponding to the first sector is updated with the data that needs to be written to the first sector, and updated data of the storage space is written to the flash memory of the SSD to replace original data of a physical page in which a UNC occurs, which resolves a problem that repair in a unit of sector is not successful when a UNC occurs in an entire page.

In addition, a valid flag corresponding to each sector in the page is set. Therefore, in a case in which no entry is added for a system, it is implemented that a UNC problem that occurs in the entire page is gradually repaired in a unit of sector, and flexibility of the system is improved.

Through the description of the foregoing implementation manners, it may be clearly understood by a person skilled in the art that, for the purpose of convenient and brief description, division of the foregoing functional modules is taken as an example for illustration. In actual application, the foregoing functions can be allocated to different functional modules and implemented as required, that is, an inner structure of an apparatus is divided into different functional modules to implement all or some of the functions described above. For a detailed working process of the foregoing apparatus, refer to a corresponding process in the foregoing method embodiments, and details are not described herein again.

In the several embodiments provided in the present application, it should be understood that the disclosed apparatus and method may be implemented in other manners. For example, the described apparatus embodiment is merely exemplary. For example, the module or unit division is merely logical function division and may be other division in actual implementation. For example, a plurality of units or components may be combined or integrated into another apparatus, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may be one or more physical units, that is, may be located in one position, or may be distributed on a plurality of different positions. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The software product is stored in a storage medium and includes several instructions for instructing a device (which may be a single-chip microcomputer, a chip, or the like) or a processor to perform all or some of the steps of the methods described in the embodiments of the present disclosure. The foregoing storage medium includes any medium that can store program code, such as a universal serial bus (USB) flash drive, a removable hard disk, a ROM, a RAM, a magnetic disk, or an optical disc.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A bad sector repair method, comprising:
   receiving, by a solid state disk (SSD), a first write operation instruction from a host, the first write operation instruction comprising a logical block address (LBA) of a first sector and data that needs to be written to the first sector;
   reading, according to the LBA of the first sector, data of a physical page in which the first sector is located;
   allocating, in a cache, storage space with a same size as the physical page, wherein the cache is a volatile memory;
   writing preset data from the host into the storage space allocated in the cache in response to when reading the data of the physical page fails, the storage space comprising at least two storage areas, and each of the storage areas corresponding to a sector of the physical page;
   updating, according to the LBA of the first sector, preset data that is of a storage area corresponding to the first sector and within the storage space with the data that needs to be written to the first sector; and
   writing the updated data in the storage space to a flash memory of the SSD to repair the first sector.

2. The bad sector repair method of claim 1, wherein the method further comprises:
   setting a flag of each storage area in the storage space to a first flag after allocating, in the cache, storage space with the same size as the physical page, the first flag indicating that data in the storage area is invalid data;
   setting the flag of the storage area corresponding to the first sector to a second flag after updating, according to the LBA of the first sector, preset data of the storage area corresponding to the first sector and within the storage space with the data that needs to be written to the first sector, the second flag indicating that data in the storage area is valid data; and
   writing the flag of each storage area in the storage space to redundant space of the SSD after updating, according to the LBA of the first sector, preset data of the storage area corresponding to the first sector and within the storage space with the data that needs to be written to the first sector.

3. The bad sector repair method of claim 2, wherein after writing data in the storage space to the flash memory of the SSD according to the address of the physical page, the method further comprises:
   receiving a second write operation instruction from the host, the second write operation instruction comprising an LBA of a second sector in the physical page and data that needs to be written to the second sector;

reading the data of the physical page and a flag of each sector in the physical page into the cache according to the LBA of the second sector;

updating preset data of the second sector with the data that needs to be written to the second sector according to the LBA of the second sector;

setting a flag of the second sector to the second flag; and writing updated data of the physical page and the flag of each sector in the physical page to the flash memory of the SSD to repair the second sector, the flag of each sector in the physical page being written to the redundant space of the SSD.

4. The bad sector repair method of claim 2, further comprising:

receiving a read operation instruction from the host, the read operation instruction comprising an LBA of a to-be-read sector;

acquiring a flag of the to-be-read sector according to the LBA of the to-be-read sector; and sending a response message to the host When the flag of the to-be-read sector is the first flag, the response message notifying the host that data of the sector is invalid data.

5. The bad sector repair method of claim 4, further comprising:

reading the data of the sector when the flag of the to-be-read sector is the second flag; and sending the data of the sector to the host.

6. A bad sector repair apparatus, comprising:

a receiver configured to receive a first write operation instruction from a host, the first write operation instruction comprising a logical block address (LBA) of a first sector and data that needs to be written to the first sector;

a processor coupled to the receiver and configured to:

read, according to the LBA of the first sector that is obtained by the receiver, data of a physical page in which the first sector is located;

allocate, in a cache, storage space with a same size as the physical page, wherein the cache is a volatile memory;

write preset data from the host into the storage space allocated in the cache in response to when reading the data of the physical page fails, the storage space comprising at least two storage areas, and each of the storage areas corresponding to a sector of the physical page;

update, according to the LBA of the first sector obtained by the receiver, preset data that is of a storage area corresponding to the first sector and within the storage space with the data that needs to be written to the first sector; and write the updated data in the storage space to a flash memory of a solid state disk (SSD) to repair the first sector.

7. The bad sector repair apparatus of claim 6, wherein the processor is further configured to:

set a flag of each storage area in the storage space to a first flag after allocating, in the cache, storage space with a same size as the physical page, the first flag indicating that data in the storage area is invalid data;

set the flag of the storage area corresponding to the first sector to a second flag after updating, according to the LBA of the first sector, the preset data that is of the storage area corresponding to the first sector and in the storage space with the data that needs to be written to the first sector, the second flag indicating that data in the storage area is valid data; and write the flag of each storage area in the storage space to redundant space of the SSD.

8. The bad sector repair apparatus of claim 7, wherein the receiver is further configured to receive a second write operation instruction from the host after the processor writes the data in the storage space to the flash memory of the SSD according to the address of the physical page, the second write operation instruction comprising an LBA of a second sector in the physical page and data that needs to be written to the second sector, and the processor being further configured to:

read the data of the physical page and a flag of each sector in the physical page into the cache according to the LBA of the second sector that is obtained by the receiver;

update preset data of the second sector with the data that needs to be written to the second sector according to the LBA of the second sector that is obtained by the receiving module;

set a flag of the second sector to the second flag; and write updated data of the physical page and the flag of each sector in the physical page to the flash memory of the SSD to complete repair on the second sector, the flag of each sector in the physical page being written to the redundant space of the SSD.

9. The bad sector repair apparatus of claim 7, wherein the receiver is further configured to receive a read operation instruction from the host, the read operation instruction comprising an LBA of a to-be-read sector, and the processor being further configured to:

acquire a flag of the to-be-read sector according to the IBA of the to-be-read sector that is obtained by the receiver; and send a response message to the host when the flag of the to-be-read sector that is obtained is the first flag, the response message notifying the host that data of the sector is invalid data.

10. The bad sector repair apparatus of to claim 9, wherein the processor is further configured to:

read the data of the sector when the flag of the to-be-read sector that is obtained is the second flag; and send the data of the sector to the host.

11. A bad sector repair apparatus, comprising:

a bus interface configured to receive a first write operation instruction from a host, the first write operation instruction including a logical block address (LBA) of a first sector and data that needs to be written to the first sector; and a processor coupled to the bus interface and configured to:

receive the first write operation instruction from the host, the first write operation instruction comprising the LBA of the first sector and data that needs to be written to the first sector;

read, according to the LBA of the first sector, data of a physical page in which the first sector is located;

allocate, in a cache, storage space with a same size as the physical page, wherein the cache is a volatile memory;

write preset data from the host into the storage space allocated in the cache in response to when reading the data of the physical page fails, the storage space comprising at least two storage areas, and each of the storage areas corresponding to a sector of the physical page;

update, according to the LBA of the first sector, preset data that is of the storage area corresponding to the first sector and within the storage space with the data that needs to be written to the first sector; and write the updated data in the storage space to a flash memory of a solid state disk (SSD) to repair the first sector.

12. The bad sector repair apparatus of claim 11, wherein the processor is further configured to:

set a flag of each storage area in the storage space to a first flag after allocating, in the cache, storage space with the same size as the physical page, the first flag indicating data in the storage area is invalid data; and set the flag of the storage area corresponding to the first sector to a second flag after the processor updates, according to the LBA of the first sector, preset data of a storage area corresponding to the first sector and within the storage space with the data that needs to be written to the first sector, the second flag indicating that data in the storage area is valid data; and write the flag of each storage area in the storage space to redundant space of the SSD.

13. The bad sector repair apparatus of claim 12, wherein the processor is further configured to:

receive a second write operation instruction from the host after writing data in the storage space to the flash memory of the SSD according to an address of the physical page, the second write operation instruction comprising an LBA of a second sector in the physical page and data that needs to be written to the second sector;

read the data of the physical page and a flag of each sector in the physical page into the cache according to the LBA of the second sector;

update preset data of the second sector with the data that needs to be written to the second sector according to the LBA of the second sector;

set a flag of the second sector to the second flag; and write updated data of the physical page and the flag of each sector in the physical page to the flash memory of the SSD to repair the second sector, the flag of each sector in the physical page being written to the redundant space of the SSD.

14. The bad sector repair apparatus of claim 12, wherein the processor is further configured to:

receive a read operation instruction from the host, the read operation instruction comprising an LBA of a to-be-read sector;

acquire a flag of the to-be-read sector according to the LBA of the to-be-read sector; and send a response message to the host when the flag of the to-be-read sector is the first flag, the response message notifying the host that data of the sector is invalid data.

15. The bad sector repair apparatus of claim 14, wherein the processor is further configured to:

read the data of the sector when the flag of the to-be-read sector is the second flag; and send the data of the sector to the host.

* * * * *

UNITED STATES PATENT AND TRADEMARK OFFICE
CERTIFICATE OF CORRECTION

PATENT NO. : 10,127,099 B2
APPLICATION NO. : 15/056402
DATED : November 13, 2018
INVENTOR(S) : Meng Zhou, Yan Li and Jianhua Zhou Page 1 of 1

It is certified that error appears in the above-identified patent and that said Letters Patent is hereby corrected as shown below:

On the Title Page

Item (30), Line 1: "201310378406" should read "201310378406.9"

In the Claims

Column 19, Line 20 In Claim 4: "When" should read "when"

Column 20, Line 41 In Claim 10: delete "to"

Signed and Sealed this
Eighth Day of January, 2019

Andrei Iancu
*Director of the United States Patent and Trademark Office*